US007407640B2

(12) United States Patent
Barrera et al.

(10) Patent No.: US 7,407,640 B2
(45) Date of Patent: Aug. 5, 2008

(54) FUNCTIONALIZED CARBON NANOTUBE-POLYMER COMPOSITES AND INTERACTIONS WITH RADIATION

(75) Inventors: Enrique V. Barrera, Houston, TX (US); Richard Wilkins, College Station, TX (US); Meisha Shofner, Watervliet, NY (US); Merlyn X. Pulikkathara, Houston, TX (US); Ranjii Vaidyanathan, Tuscon, AZ (US)

(73) Assignee: William Marsh Rice University, Houston, TX (US)

( * ) Notice: Subject to any disclaimer, the term of this patent is extended or adjusted under 35 U.S.C. 154(b) by 179 days.

(21) Appl. No.: 10/536,688

(22) PCT Filed: Nov. 25, 2003

(86) PCT No.: PCT/US03/38141

§ 371 (c)(1),
(2), (4) Date: May 27, 2005

(87) PCT Pub. No.: WO2004/070349

PCT Pub. Date: Aug. 19, 2004

(65) Prior Publication Data

US 2006/0202168 A1    Sep. 14, 2006

Related U.S. Application Data

(60) Provisional application No. 60/429,642, filed on Nov. 27, 2002.

(51) Int. Cl.
*B01J 19/08* (2006.01)
(52) U.S. Cl. .............. 423/447.1; 252/500; 252/501.1; 252/502; 252/510; 252/511; 423/414; 423/445 B; 423/445 R; 423/460; 204/157.15; 204/157.43

(58) Field of Classification Search ................ 252/500, 252/501.1, 502, 510, 511; 423/447.1, 414, 423/445 B, 445 R, 460; 204/157.15, 157.43
See application file for complete search history.

(56) References Cited

U.S. PATENT DOCUMENTS

| 5,374,415 | A | 12/1994 | Alig et al. |
| 2001/0041160 | A1* | 11/2001 | Margrave et al. ............ 423/460 |
| 2003/0042128 | A1* | 3/2003 | Harutyunyan et al. .... 204/158.2 |
| 2004/0029706 | A1 | 2/2004 | Barrera et al. |
| 2004/0071949 | A1* | 4/2004 | Glatkowski et al. ...... 428/313.3 |

OTHER PUBLICATIONS

Xie et al. ("Ultraviolet-curable polymers with chemically bonded carbon nanotubes for microelectrochemical system applications." Smart Mater. Struct. 11, pp. 575-580, published online on Jul. 23, 2002.*

(Continued)

*Primary Examiner*—Mark Kopec
*Assistant Examiner*—Tri V Nguyen
(74) *Attorney, Agent, or Firm*—Robert C. Shaddox; Winstead PC

(57) ABSTRACT

The present invention involves the interaction of radiation with functionalized carbon nanotubes that have been incorporated into various host materials, particularly polymeric ones. The present invention is directed to chemistries, methods, and apparatuses which exploit this type of radiation interaction, and to the materials which result from such interactions. The present invention is also directed toward the time dependent behavior of functionalized carbon nanotubes in such composite systems.

9 Claims, 4 Drawing Sheets

OTHER PUBLICATIONS

Geng et al. ("Fabrication and properties of composites of poly(ethylene oxide) and functionalized carbon nanotubes." Adv. Mater. vol. 14, pp. 1387-1390, Oct. 2002).*

Muisener et al. ("Effects of gamma radiation on poly(methyl methacrylate)/single-wall nanotube composite", J. Mater. Res., vol. 17, pp. 2507-2513, Oct. 2002).*

Iijima, "Helical microtubules of graphitic carbon", 354 Nature (1991) pp. 56-58.

Iijima et al., "Single-shell carbon nanotubes of 1nm diameter", 363 Nature (1993) pp. 603-605.

Bethune et al., "cobalt-catalysed growth of carbon nanotubes with single-atomic-layer walls", 363 Nature (1993), pp. 605-607, 1993.

Barrera, "Key Methods for Developing Single-Wall Nanotube Composites" 52 J. of Mater. (Nov. 2000), pp. 38-42, 2000.

Thess et al., "Crystalline Ropes of Metallic Carbon Nanotubes", 273 Science (1996), pp. 483-487, 1996.

Hone et al., "Electrical and thermal transport properties of magnetically aligned single wall carbon nanotube films", 77 Appl. Phys. Lett. (2000), pp. 666-668.

Yu et al., "Tensile Loading of Ropes of Single Wall Carbon Nanotubes and their Mechanical Properties", 84 Phys. Rev. Lett. (2000), pp. 5552-5555.

O'Rourke, "Effects of gamma radiation on poly(methyl methacrylate)/single-wall nanotube composites", 17 J. Mater. Res. 10 (2002). pp. 2507-2513.

Klimov et al., "Monochromatic gamma radiation emitted by relativistic electron moving in a carbon nanotube", 226 Physics Letters A (1997), pp. 244-252.

Cui et al., "Atomistic simulation of radiation damage to carbon nanotube", 295 Physics Letters A (2002), pp. 55-59.

Salonen et al., "Ion-irradiation-induced defects in bundles of carbon nanotubes" 193 Nuclear Instruments and Method in Physics Research B, (2002), pp. 603-608.

Ye et al., "Hydrogen adsorption and cohesive energy of single-walled carbon nanotubes" 74 Appl. Phys. Lett. 16, (1999), pp. 2307-2309.

Wilson et al. (Eds.), Shielding Strategies for Human Space Exploration, NASA Conference publication 3360 (1997), pp. 17-28.

Liu et al., "Fullerene Pipes", 280 Science (1998), pp. 1253-1256.

Bahr et al., "Functionalization of Carbon Nanotubes by Electrochemical Reduction of Aryl Diazonium Salts: A Bucky Paper Electrode", 123 J. Am. Chem. Soc. (2001), pp. 6536-6542.

Holzinger et al., "Sidewall Functionalization of Carbon Nanotubes" 40 Angew. Chem. Int. Ed. 21 (2001), pp. 4002-4005.

Khabashesku et al., "Fluorination of single-wall carbon nanotubes and subsequent derivatization reactions", 35 Acc. Chem. Res. (2002), pp. 1087-1095.

Mickelson et al., "Solvation of Fluorinated Single-Wall Carbon Nanotubes in Alcohol Solvents", 103 J. Phys. Chem. B (1999), pp. 4318-4322.

Boul et al., "Reversible sidewall functionalization of buckytubes" 310 Chem. Phys. Lett. (1999), pp. 367-372.

Ebbesen, "Carbon Nanotubes", 24 Annu. Rev. Mater. Sci., (1994), pp. 235-264.

Vander Wal et al., "Flame synethesis of Fe catalyzed single-wall carbon nanotubes and Ni catalyzed nanofibers: . . . ", 349 Chem. Phys. Lett. (2001), pp. 178-184.

Hafner et al., "Catalytic growth of single-wall carbon nanotubes from metal particles", 296 Chem. Phys. Lett. (1998), pp. 195-202.

Cheng et al., "Bulk morphology and diameter distribution of single-walled carbon nanotubes . . . " 289 Chem. Phys. Lett. (1998),pp. 602-610.

Nikolaev et al., "Gas-phase catalytic growth of single-walled carbon nanotubes from carbon monoxide", 313 Chem. Phys. Lett. (1999), pp. 91-97.

O'Connell et al., "Band Gap Fluorescence from Individual Single-Walled Carbon Nanotubes", 297 Science (2002), pp. 593-596.

Bachilo et al., "Structure-Assigned Optical Spectra of Single-Walled Carbon Nanotubes" 298 Science (2002), pp. 2361-2366.

Strano et al., "Electronic Structure Control of Single-Walled Carbon Nanotube Functionalization" 301 Science (2003), pp. 1519-1522.

Chiang et al., "Purification and Characterization of Single-Wall Carbon Nanotubes", 105 J. Phys. Chem. B (2001), pp. 1157-1161.

Chiang et al., "Purification and Characterization of Single-Wall Carbon Nanotubes Obtained from the Gas-Phase . . . ", 105 J. Phys. Chem. B (2001), pp. 8297-8301.

Gu et al., "Cutting Single-Wall Carbon Nanotubes through Fluorination", 2 Nano Lett. 9, (2002), pp. 1009-1013.

Chen et al., "Solution-Properties of Single-Walled Carbon Nanotubes", 282 Science (1998), pp. 95-98.

Mickelson et al., "Fluorination of single-wall carbon nanotubes", 296 Chem. Phys. Lett. (1998), pp. 188-194.

Bahr et al., "Highly Functionalized Carbon nanotubes Using In Situ generated Diazonium Compounds", 13 Chem. Mater. (2001), pp. 3823-3824.

Stevens et al., "Sidewall Amino-Functionalization of Single-Walled Carbon Nanotubes through Fluorination . . . ", 3 Nano Lett. 3 (2003), pp. 331-336.

Pekker et al., "Hydrogenation of Carbon Nanotubes and Graphite in Liquid Ammonia", 105 J. Phys. Chem. B (2001), pp. 7938-7943.

Rinzler et al, "Large-scale purification of single-wall carbon nanotubes: process, product, and characterization", 67 Appl. Phys. A (1998), pp. 29-37.

Bronikowski et al., "Gas-phase production fo carbon single-walled nanotubes from carbon monoxide via the HiPco process: . . . ", 19 J. Vac. Sci. Technol. 4 (2001), pp. 1800-1805.

Chiang et al., "Covalent Sidewall Functionalization of Single-Wall Carbon Nanotubes", proc. of 6th Appl. Diamond Conf. (2001), pp. 687-693.

Cooper et al., "Distribution and alignment of carbon nanotubes and nanofibrils in a polymer matrix", 62 Composites Sci. & Technol. (2002), pp. 1105-1112.

* cited by examiner

FUNCTIONALIZED CARBON NANOTUBE-POLYMER COMPOSITES AND INTERACTIONS WITH RADIATION

CROSS REFERENCE TO RELATED APPLICATIONS

The present application claims priority to U.S. Provisional Application Ser. No. 60/429,642, filed Nov. 27, 2002.

This work was supported by a small business innovative research (SBIR) awarded by the National Aeronautics and Space Administration (NASA), grant number NAS2-02102; a NASA Cooperative Agreement, grant number NCC-1-02038 (URETI); and the Robert A. Welch Foundation, grant number C1494.

TECHNICAL FIELD

The present invention relates generally to materials, and more specifically to composite or blended materials comprising carbon nanotubes, and said materials' interactions with radiation.

BACKGROUND INFORMATION

Since the discovery of carbon nanotubes in 1991 [Iijima, Nature, 354, pp. 56-58, 1991] and single-wall carbon nanotubes in 1993 [Iijima et al., Nature, 363, pp. 603-605, 1993; Bethune et al., Nature, 363, pp. 605-607, 1993], research has been conducted to exploit their unique mechanical, electrical, and thermal properties to create multifunctional composite materials [Barrera, J. of Mater., 52, pp. 38-42, 2000]. Previous research has shown that single-wall carbon nanotubes have the highest conductivity of any known fiber [Thess et al., Science, 273, pp. 483-487, 1996], a higher thermal conductivity than diamond [Hone et al., Appl. Phys. Lett., 77, pp. 666-668, 2000], and the highest stiffness of any known fiber [Yu et al., Phys. Rev. Lett., 84, pp. 5552-5555, 2000].

Due to the provocative geometry and other remarkable properties of carbon nanotubes, they are of considerable interest to the aerospace and radiation communities [O'Rourke, J. Mater. Res., 17(10), 2002; Klimov et al., Physics Letters A, 226, pp. 244-252, 1997; Cui et al., Physics Letters A, 295, pp. 55-59, 2002; Salonen et al., Nuclear Instruments and Method in Physics Research B, 193, pp. 603-608, 2002]. The possibility of nanotubes serving as a storage medium for hydrogen [Ye et al., Appl. Phys. Lett, 74(16), pp. 2307-2309, 1999] is of particular interest for future spacecraft (e.g., fuel cells), and hydrogen-rich and other low atomic mass materials are believed to minimize radiation exposure in space environments [Wilson et al. (Eds.), Shielding Strategies for Human Space Exploration, NASA Conference publication 3360, pp. 17-28, 1997].

Efforts to exploit carbon nanotube properties invariably rely on the ability to manipulate and homogeneously disperse carbon nanotubes in other host materials and/or matrices. Such manipulability can be facilitated by chemical modification of the carbon nanotube ends [Liu et al., Science, 280, pp. 1253-1256, 1998; Chen et al., Science, 282, pp. 95-98, 1998] and/or sidewalls [Bahr et al., J. Am. Chem. Soc., 123, pp. 6536-6542, 2001; Holzinger et al., Angew. Chem. Int. Ed., 40(21), pp. 4002-4005, 2001; Khabashesku et al., Acc. Chem. Res., 35, 1087-1095, 2002] of the carbon nanotubes. However, for many applications, such as those requiring highly conductive carbon nanotubes, the chemically modified or functionalized carbon nanotubes are unsuitable for the final product. Current techniques of chemically [Mickelson et al., J. Phys. Chem. B, 103, pp. 4318-4322, 1999] and thermally [Boul et al., Chem. Phys. Lett., 310, pp. 367-372, 1999; Bahr et al., J. Am. Chem. Soc., 123, pp. 6536-6542, 2001] defunctionalizing functionalized carbon nanotubes place severe restrictions on the types of other materials used in the various substrates, devices, and composite/blended materials originally comprising the functionalized carbon nanotubes.

SUMMARY

The present invention is directed toward methods of incorporating functionalized carbon nanotubes into host matrices to form composites and/or blends. In some embodiments, these host matrices are polymeric. In some embodiments, these functionalized carbon nanotubes are fluorinated. In some embodiments, functionalized carbon nanotubes are aligned within the composite and/or blend. The present invention is also directed toward methods of removing functional species (e.g., fluorine) from functionalized carbon nanotubes within such composites or blends via a radiative means.

The present invention is also directed toward methods of radiatively-modifying carbon nanotube composites and/or blends. In some embodiments, this comprises a curing process. In some embodiments, this comprises a hardening process. In some embodiments, this leads to the formation of hybrid systems wherein carbon nanotubes are effectively crosslinked with a polymeric host material, wherein radiation effects the necessary crosslinking processes.

In some embodiments, radiation interaction with functionalized carbon nanotube composites and/or blends leads to a defunctionalization of the functionalized carbon nanotubes. In some embodiments this defunctionalization is selective. In some embodiments, this defunctionalization converts the non-conductive functionalized carbon nanotubes into conductive non-functionalized carbon nanotubes.

The present invention is directed to apparatuses comprising carbon nanotubes incorporated into, or housed within, a host matrix, and methods for making same. In some embodiments, the host matrix is polymeric. In some embodiments, conductive carbon nanotube channels exist within a block or film of material comprising nonconductive functionalized carbon nanotubes. In some embodiments, lithographic techniques are employed to generate said conductive carbon nanotube channels by, for example, lithographically defunctionalizing functionalized carbon nanotubes. In some embodiments, free-form extraction methods are used to generate three-dimensional arrays of conductive carbon nanotube channels within a composite or blended material. The present invention is also directed toward radiation sensors (e.g., dosimeters) comprising functionalized carbon nanotubes in a host material matrix The present invention is directed toward multi-functional materials comprising functionalized carbon nanotubes and a host material, wherein said materials' function changes as it exposed to radiation over a period of time—continuously changing the properties of the composite and/or blend material.

The present invention is also directed toward methods of recapturing or recycling nanotubes from composites and/or blends comprising functionalized carbon nanotubes and a polymer host matrix.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
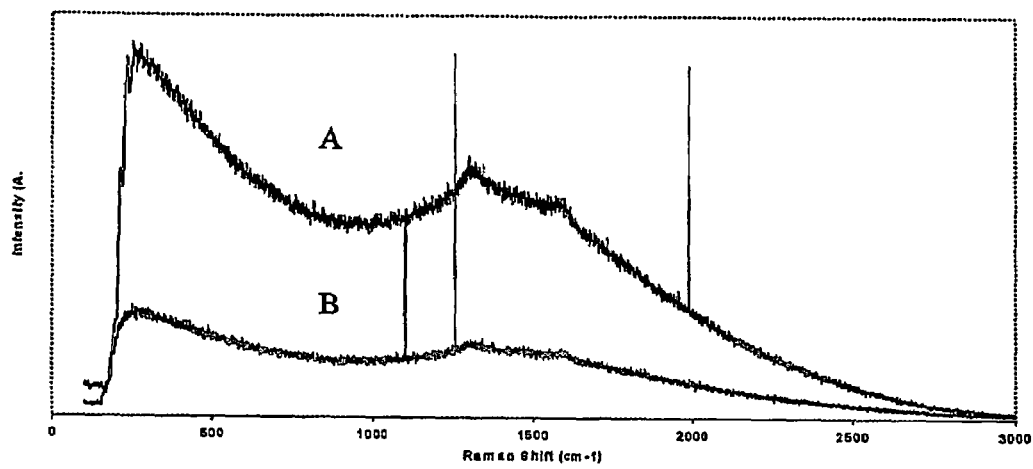
FIG. 1 depicts Raman spectra of (a) pre- and (b) post-irradiation of 1.5% wt. Fluorinated Tubes@Rice SWNTs/MDPE.

The present invention is directed toward carbon nanotube composites and/or blends, and to methods for making such composites and/or blends. The present invention also involves the interaction of radiation with functionalized carbon nanotubes that have been incorporated into host materials (e.g., composites and/or blends). The present invention is therefore also directed to chemistries, methods, and apparatuses which exploit this type of radiation interaction, and to the materials which result from such interactions.

The present invention provides for processes that uniformly disperse carbon nanotubes in other host materials. The present invention provides for polymer composites and/or blends comprising unroped individual carbon nanotubes (CNTs) dispersed throughout a polymer host matrix, and methods for making same. The present invention provides for methods of preparing CNT-polymer composites and/or blends wherein interactions between the CNTs and a polymer host can be induced and/or altered by radiation exposure. The present invention provides for a material system that can be altered by radiation in both terrestrial and space environments. The present invention provides for a method of preparing continuous fibers comprising CNTs in situ to the fiber making process and where radiation exposure can be used to alter the fiber chemistry in order to engineer into said fibers desired properties. The present invention provides methods of making multifunctional materials with CNTS, wherein radiation exposure is used to impart property changes or enhancements. The present invention provides for methods of preparing coating systems of which CNTs are a component and wherein radiation can be used to impact changes to the coating or to selected regions of the coating. The present invention provides for methods of making plastic parts and panels wherein the properties of the part can vary based upon where and how long they have been exposed to radiation. The present invention provides for methods wherein CNT-polymer composite circuit boards can be made. In such embodiments, CNT alteration induced by selective radiation exposure can generate electronic devices. In such embodiments, templating on a polymer substrate can be carried out in order to enhance electrical conduction or create variations in the material's electrical properties in specific regions. The present invention also provides for time-dependent multifunctional materials comprising functionalized CNTs and a polymeric host, wherein said materials' function changes as it is exposed to radiation over a period of time. Furthermore, the present invention also provides a method of reclaiming or recycling the CNTs from the CNT-composites and/or blends at the end of their life cycle.

Carbon nanotubes (CNTs), according to the present invention, include, but are not limited to, single-wall carbon nanotubes (SWNTs), multi-wall carbon nanotubes (MWNTs), double-wall carbon nanotubes, buckytubes, fullerene tubes, tubular fullerenes, graphite fibrils, carbon whiskers, vapor grown carbon fibers, and combinations thereof. Such carbon nanotubes can be made by any known technique including, but not limited to, arc discharge [Ebbesen, Annu. Rev. Mater. Sci., 24, pp. 235-264, 1994], laser oven [Thess et al., Science, 273, pp. 483-487, 1996], flame synthesis [Vander Wal et al., Chem. Phys. Lett., 349, pp. 178-184, 2001], chemical vapor deposition [U.S. Pat. No. 5,374,415], wherein a supported [Hafner et al., Chem. Phys. Lett., 296, pp. 195-202, 1998] or an unsupported [Cheng et al., Chem. Phys. Lett., 289, pp. 602-610, 1998; Nikolaev et al., Chem. Phys. Lett., 313, pp. 91-97, 1999] metal catalyst may also be used, and combinations thereof. In some embodiments, the CNTs are separated based on a property selected from the group consisting of chirality, electrical conductivity, thermal conductivity, diameter, length, number of walls, and combinations thereof. See O'Connell et al., Science, 297, pp. 593-596, 2002; Bachilo et al., Science, 298, pp. 2361-2366, 2002; Strano et al., Science, 301, pp. 1519-1522, 2003; all of which are incorporated herein by reference. In some embodiments, the CNTs have been purified. Exemplary purification techniques include, but are not limited to, Chiang et al., J. Phys. Chem. B, 105, pp. 1157-1161, 2001; Chiang et al., J. Phys. Chem. B, 105, pp. 8297-8301, 2001, both of which are incorporated herein by reference. In some embodiments, the CNTs have been cut by a cutting process. See Liu et al., Science, 280, pp. 1253-1256, 1998; Gu et al., Nano Lett., 2(9), pp. 1009-1013, 2002, both of which are incorporated by reference. In some embodiments, the CNTs are crosslinked with each other (e.g., by shear pressure).

In some embodiments of the present invention, the carbon nanotubes are functionalized. Functionalization includes, but is not limited to, fluorination. For examples of suitable functionalized CNTs and methods of functionalizing CNTs, see Mickelson et al., Chem Phys. Lett., 296, pp. 188-194, 1998; Bahr et al., J. Am. Chem. Soc., 123, pp. 6536-6542, 2001; Holzinger et al., Angew. Chem Int. Ed., 40(21), pp. 4002-4005, 2001; Khabashesku et al., Acc. Chem. Res., 35, pp. 1087-1095, 2002; Mickelson et al., J. Phys. Chem B, 103, pp. 4318-4322, 1999; Boul et al., Chem Phys. Lett., 310, pp. 367-372, 1999; Bahr et al., Chem. Mater., 13, pp. 3823-3824, 2001; Stevens et al., Nano Lett., 3(3), pp. 331-336, 2003; Pekker et al., J. Phys. Chem. B, 105, pp. 7938-7943, 2001; all of which are incorporated herein by reference.

Host materials into which functionalized CNTs are incorporated include, but are not limited to, metals, ceramics, semiconductors, sol-gels, alloys, metalloids, polymers, fluids, oils, waxes, solvents, and combinations thereof. In some embodiments, functionalized CNTs are incorporated into ceramic hosts in a manner similar to that described in commonly-assigned, co-pending U.S. patent application Ser. No. 10/366,183, filed Feb. 13, 2003.

Polymeric host materials, as described herein, include, but are not limited to, thermoplastics, thermosets, co-polymers, elastomers, silicones, fluorinated polymers, epoxies, and combinations thereof. In some embodiments, said polymeric host materials comprise additives, which include, but are not limited to, plasticizers, curing agents, catalysts, and combinations thereof.

The present invention is directed toward methods of incorporating functionalized CNTs into polymer matrices to form CNT-polymer composites and/or blends. This is typically done by 1) dispersing functionalized CNTs in a solvent to form a dispersion, 2) adding the dispersion to polymer material of suitable form using an incipient wetting process, 3) removing the solvent to form functionalized CNT-covered polymer particulates, and 4) blending the functionalized CNT-covered polymer particulates at a temperature in excess of the melting point of the polymer used.

In some embodiments, these functionalized CNTs are fluorinated CNTs (F—CNTs). In some embodiments of the present invention, fluorination and/or additional/other functionalization is used to achieve dispersions of unbundled CNTs in materials, wherein the CNTs are unroped and largely separated. In some embodiments, the solvent is selected from the group consisting of alcohols, N,N-dimethylformamide, benzene, toluene, xylene, dichlorobenzene, chloroform, dichloromethane, and combinations thereof. Polymer material of suitable form, according to the present invention, includes, but is not limited to, particles, fibers, and combinations thereof. Fibers include, but are not limited to, weaves, rowing, tows, mats, and combinations thereof. In some embodiments, functionalized CNTs are aligned (e.g., by shearing action) within the composite and/or blend. Rapid prototyping, for example, can effect this type of alignment by its extrusion process.

Fluorination of CNTs, for example, can facilitate the unroping of single-wall carbon nanotubes from nanotube ropes or bundles. Processing of fluorinated carbon nanotubes (F-CNTs) in polymers can lead to dispersions of F-CNTs in the polymer. In many cases, these dispersions comprise highly dispersed individually unroped CNTs (this is particularly true for SWNTs—which have a strong propensity to agglomerate into bundles and/or ropes). Raman spectroscopy can be used to study these dispersions and show that the fluorinated carbon nanotubes can maintain their fluorinated condition even after processing. In some embodiments, the fluorinated carbon nanotubes are further functionalized, as described in Boul et al., Chem. Phys. Lett., 310, pp. 367-372, 1999, and incorporated herein by reference.

In some embodiments, the polymer host may be generated (i.e., polymerized from monomeric precursors) within, or in the midst of, the dispersion of functionalized CNTs. In some embodiments the functionalized CNTs are dispersed in a solution comprising polymeric precursors. In some embodiments, such as those utilizing an epoxy host material the functionalized CNTs are added prior to any curing events, and they can be incipient wet to the starting fiber system.

Functionalized CNTs are generally added in a quantity which ranges from about 0 wt. % to about 99 wt. %, and more typically from about 0.2 wt. % to about 50 wt. % (of the total CNT-composite and/or blend).

The present invention is also directed toward methods of radiatively-modifying carbon nanotube composites or blends. In some embodiments, this comprises a curing process. In some embodiments, this comprises a hardening process. In some embodiments; this leads to the formation of hybrid systems wherein carbon nanotubes are effectively crosslinked with a polymeric host material wherein radiation effects the necessary crosslinking processes. In some embodiments of the present invention, radiation exposure leads to an alteration of the properties of F-CNTs and other functionalized CNTs within a polymer host material by effecting reaction, further curing, crosslinking, bonding, or oxidation of the nanotubes in situ within the polymer host or matrix system. In some embodiments, radiation is used to defunctionalize the defunctionalized CNTs. In some of these latter embodiments, this liberates species from the nanotube into a controlled environment.

Radiation, according to the present invention, includes, but is not limited to, electromagnetic radiation, particle radiation, and combinations thereof. Exemplary forms of such radiation include, but are not limited to, ultraviolet (UV), infrared (IR), X-ray, gamma ray ($\gamma$-ray), protons ($H^+$), neutrons, electrons, alpha particles ($\alpha$-particles), heavy ions, cosmic radiation, solar wind, and combinations thereof. Cosmic radiation, according to the present invention, includes, but is not limited to, ions, ranging in size from hydrogen to uranium, that have been accelerated to extremely high energies.

Using fluorinated CNTs to impart specified nanotube conditions within a polymer (e.g., a high degree of dispersion), and using radiation sources or radiation in space to alter, remove, react, or further functionalize the nanotubes in an effort to provide a range of properties that include, but are not limited to, radiation protection, enhanced strength, improvements in electrical and thermal properties, and combinations thereof, that can ultimately lead to multifunctional nanocomposites and hybrid systems. In some embodiments of the present invention, radiation is used to alter the chemistry of the nanotubes in polymer composites, hybrids and other material systems. In some embodiments, radiation exposure of a CNT-polymer composite and/or blend material can lead to a hardened surface or skin condition.

From analysis of Raman spectra, F-CNTs within polyethylene host matrices were observed to revert back to unfluorinated CNTs when exposed to radiation. While not intending to be bound by theory, the process is likely a defluorination of the F-CNTs, a promotion of H—F bonding at the expense of C—F bonding, a lowering of the nanotube surface energy, an increase in electron charge or electron flow that would drive the debonding of the fluorine at energy levels much lower than a thermally assisted reverse process from F-CNTs back to unfluorinated CNTs, or a combination of any or all of these mechanistic scenarios.

The present invention is directed to apparatuses comprising CNTs housed within a polymeric matrix, and methods for making same. In some embodiments, conductive (metallic, semi-metallic, and/or semiconducting) carbon nanotube channels exist within a block or film of material comprising nonconductive functionalized carbon nanotubes. Such apparatuses include, but are not limited to, circuit boards, sensors, micro-electrical mechanical systems (MEMS), nano-electrical mechanical systems (NEMS), and combinations thereof.

In some embodiments, lithographic techniques are employed to generate conductive carbon nanotube channels within functionalized CNT-polymer composite layers. This is accomplished by using radiation to selectively (lithographically) remove functional groups from the functionalized carbon nanotubes rendering them conductive only in the regions in which the functionalization has been removed. In some embodiments, however, the functional groups and level of functionalization is carefully chosen so that the functionalized CNTs are partially- or semi-conducting. Lithographic removal of such functionalization then creates regions of high conductivity and semiconductivity in a dielectric matrix. Such lithographic techniques may comprise any type of electromagnetic and/or particulate radiation Exemplary lithographic techniques include, but are not limited to, optical lithography, UV lithography, deep-UV lithography, X-ray lithography, scanning near-field optical lithography, electron-beam lithography, ion-beam lithography, proton-beam lithography, and combinations thereof. In some embodiments, a photomask is employed as part of the lithographic technique. In some embodiments, free-form extraction methods are used in concert with the abovementioned lithographic techniques to generate three-dimensional arrays of conductive carbon nanotube channels within a composite or blended material.

The present invention is also directed toward radiation sensors (e.g., dosimeters) comprising the functionalized CNTs-polymeric composite and/or blend materials of the present invention. In some embodiments, the functionalized CNT-polymer composite is present in the form of a layer which can range in thickness from about 10 nm to about 10 mm. As the sensor is exposed to radiation that defunctionalizes the functionalized CNTs, there is a net change in the electrical properties (e.g., conductance, conductivity, resistance, and resistivity) of the material, which can be measured with a device such as a multimeter, a voltmeter, a four-point electrical probe, and combinations thereof. With calibration and a thorough understanding of the interactions of particular kinds of radiation with a particular type of functionalized CNT, it is possible to monitor radiation dosages and fluences in real time. The sensor components are easily miniaturized such that the device can be worn by a person as a radiation badge. This offers many advantages to traditional radiation badges which must be sent out for analysis, informing the person wearing the sensor of a large dose of radiation only after the fact.

The present invention is also directed toward multi-functional materials comprising functionalized CNTs and a polymeric host, wherein said materials' function changes as it is exposed to radiation over a period of time—continuously changing the properties of the materials. In some embodiments, for example, a functionalized CNT-polymer composite might become a better radiation shield as it is irradiated.

The present invention is also directed toward methods of recapturing or recycling nanotubes from composites and/or blends comprising functionalized carbon nanotubes and a polymer host matrix.

The present invention is useful for the preparation of CNT-reinforced composites and CNT-polymer hybrids. The use of radiation exposure, either in a manufacturing process or while in outer space, can further process the composites to alter the properties of the composite by design. The present invention can provide for multifunctional CNTs and/or CNT composites and/or blends. The present invention may be used to reverse properties and or heal unwanted properties and damage. Some representative applications for the present invention are described below.

Multifunctional composites that are altered in space for space station, shuttle, satellites, and deep space spacecraft. A manner of imparting change or repair to spacecraft that involves radiation from space and little or no additional energy requirements to do so.

Materials that provide for improved shielding and/or provide for the release of desired outgassing that could act as a fuel source (e.g., fuel cells) or a means of providing an oxygen source.

Materials for new electronic devices and circuitry. Through the use of radiation of fluorinated or other functionalized nanotubes within polymer composites or blends, electronic devices can be made. Circuit boards can be made with circuitry down to nanoscale. Circuit boards or chip assemblies could be patterned via radiation exposure to produce regions that are conducting and/or semiconducting, amidst insulating and/or semiconducting regions. Additionally, radiation could be used to effect the device operation (nanoelectronics).

Materials systems with surfaces or coatings having enhanced mechanical properties and which are generated by radiation exposure of materials comprising functionalized nanotubes within a polymer host. Such radiatively-induced nanotube chemistry has the capacity to impact bonding and load transfer.

Use of radiation exposure to impact nanotubes in fluids. In such applications, nanotubes can be radiatively-altered to induce changes in the fluid which range from changes in solubility level to improved electrical and thermal properties. In some embodiments, these changes could be made to be time-dependent and/or occur over a period of time. The chemistry could be altered to allow for more favorable fluid conditions (e.g., viscosity) for a number of applications. This may also provide a method of producing nanotubes dispersed in a fluid for a subsequent use. In such cases, as the nanotubes are exposed to the radiation they (a) become defluorinated as single unroped nanotubes, (b) lose the functionalization in a manner similar to (a), the functionalization is altered when interacted with the fluid, or (c) the nanotubes in a fluid are reacted to form a continuous network through cross-linking and nanotube-to-nanotube linking.

There are clearly numerous applications for CNT-polymer composites and/or blends. The present invention provides a method for promoting property enhancement via radiation exposure from a variety of sources covering a broad range of radiation. The present invention provides for a straightforward and commercially scalable method for enhancing the properties of CNT-polymer nanocomposites and/or blends. The present invention provides new routes to composite systems not yet fully identified and opens new doors to the use of nanotubes in electronic applications. The present invention also facilitates the development of new structural composites and multifunctional CNT materials.

The following examples are included to demonstrate particular embodiments of the present invention. It should be appreciated by those of skill in the art that the methods disclosed in the examples which follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLES

Example 1

This Example serves to illustrate embodiments in which medium energy protons can be used to modify the properties of fluorinated CNT-polymer composites and/or blends.

As long term space-based experiments are not a practical way of accessing the radiation characteristics of materials, SWNT-polymer composites were irradiated with 40 MeV protons at the Texas A&M University Cyclotron Institute (TAMCI). The proton energies and the total particle fluence used in this example are consistent with the radiation environment of low earth orbit (LEO); such as the environment encountered by the International Space Station (ISS). To characterize the effects of proton irradiation on CNTs, the samples were characterized by thermogravimetric analysis (TGA) and Raman spectroscopy.

The SWNTs used in this example were obtained from Tubes@Rice and Carbon Nanotechnologies, Inc, both in purified form. These nanotubes were produced by the pulsed laser vaporization [Rinzler et al., Appl. Phys. A., 67, pp. 29-37, 1998] and High Pressure Carbon Monoxide (HiPco) [Bronikowski et al., J. Vac. Sci. & Tech. A, 19, pp. 1800-1805, 2001] processes, respectively. The CNT-polymer composites were prepared with SWNTs made by each method and with fluorinated SWNTs (F-SWNTs) comprising SWNTs made by each method. The fluorination of the SWNTs was performed by previously described methods [Mickelson et al., Chem. Phys. Lett., 296, pp. 188-194, 1998; Chiang et al, "Covalent Sidewall Functionalization of Single Wall Carbon Nanotubes," presented at Applied Diamond Conference/Second Frontier Carbon Joint Conference Proceedings 2001; Gu et al., Nano. Lett., 2(9), pp. 1009-1013, 2002; all of which are incorporated herein by reference], and comprising a stoichiometry of approximately $C_2F$. Medium density polyethylene (MDPE) was obtained from Aldrich in powder form to create the composites. The MDPE had a molecular weight of 6000 and a melting point between 109-111° C. The composite compositions studied are found in Table 1.

The composites were processed by incipient wetting followed by Banbury mixing. The incipient wetting technique creates an initial level of dispersion by coating the polymer with nanotubes [Barrera, J. Mater., 52, pp. 3842, 2000; Cooper et al., Composites Sci. & Tech., 62, pp. 1105-1112, 2002]. A polymer powder and a nanotube solution were combined and heated in an oil bath to remove the solvent. The remaining material was dried in a furnace to remove the remaining solvent. The overcoated polymer was subsequently processed by Banbury mixing and pressed into sheets by heated compression molding. The unfilled polymer was processed in the same manner for consistency.

Each composite sample was placed between two sheets of thin Mylar™ to facilitate positioning in the proton beam. The samples were irradiated with 40 MeV protons at a flux rate of about $1.7 \times 10^7$ protons per $cm^2$ per second to a total fluence of $3 \times 10^{10}$ protons/$cm^2$ (except in one case). The fluence was chosen to be consistent with the expected exposure during a long-term LEO mission. The irradiations were performed at room temperature in a vacuum of about $5 \times 10^{-5}$ Torr. The irradiation conditions for the samples are summarized in Table 1.

TABLE 1

Samples studied and radiation conditions.

| Sample | Fluence |
|---|---|
| 1.5% wt. SWNT/MDPE (purified HiPco) | $3 \times 10^{10}$ protons/$cm^2$ |
| 5% wt. SWNT/MDPE (purified HiPco) | $3 \times 10^{10}$ protons/$cm^2$ |
| 1.5% wt. F-SWNT/MDPE (laser Tubes@Rice) | $3 \times 10^{10}$ protons/$cm^2$ |
| 5% wt. F-SWNT/MDPE (HiPco) | $3 \times 10^{10}$ protons/$cm^2$ |
| 1.5% wt. F-SWNT/MDPE (HiPco) | $4.7 \times 10^{10}$ protons/$cm^2$ |
| MDPE | $3 \times 10^{10}$ protons/$cm^2$ |

The samples were characterized before and after irradiation by Raman spectroscopy. The Raman spectroscopy measurements utilized a Renishaw Micro-Raman spectrometer with 780.6 nm diode laser excitation and a resolution of 2 $cm^{-1}$. The objective used was 50× with a 0.55 μm aperture. In addition, pieces of each sample were used to perform TGA. Samples were studied both before and after irradiation. TGA was performed in a nitrogen atmosphere to ascertain whether radiation exposure may have caused any damage to the polymer. The apparatus used was a TA Instruments Model SDT 2960. Weight loss and temperature difference values were used to evaluate the materials.

Figure 2:
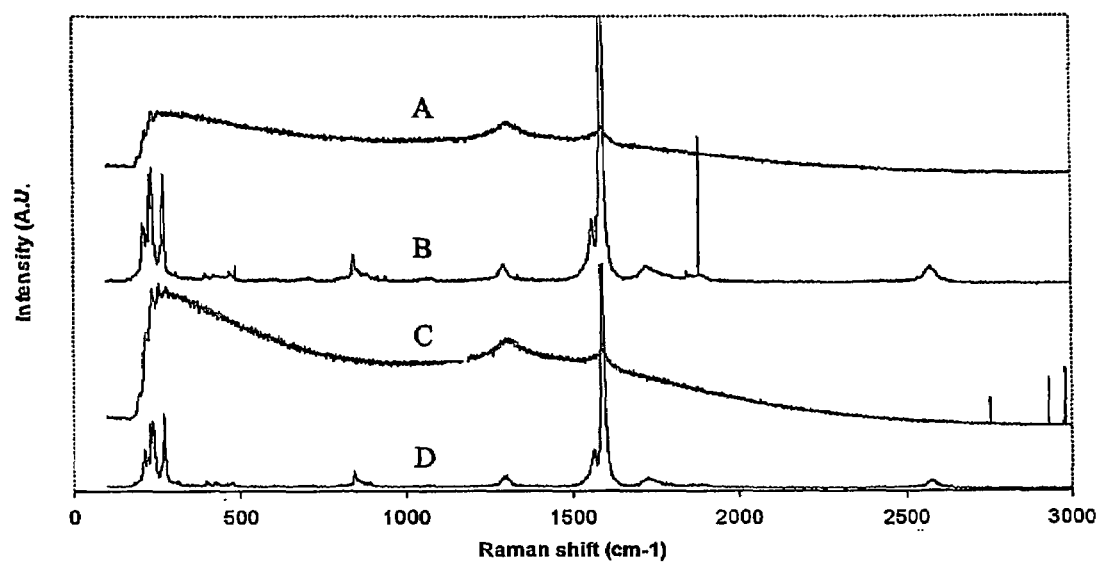
FIG. 2 depicts Raman spectra of (a) pre- and (b) post-irradiation of 5% wt. and (c) pre- and (d) post-irradiation of 1.5% fluorinated HiPco SWNTs/MDPE.
Figure 3:
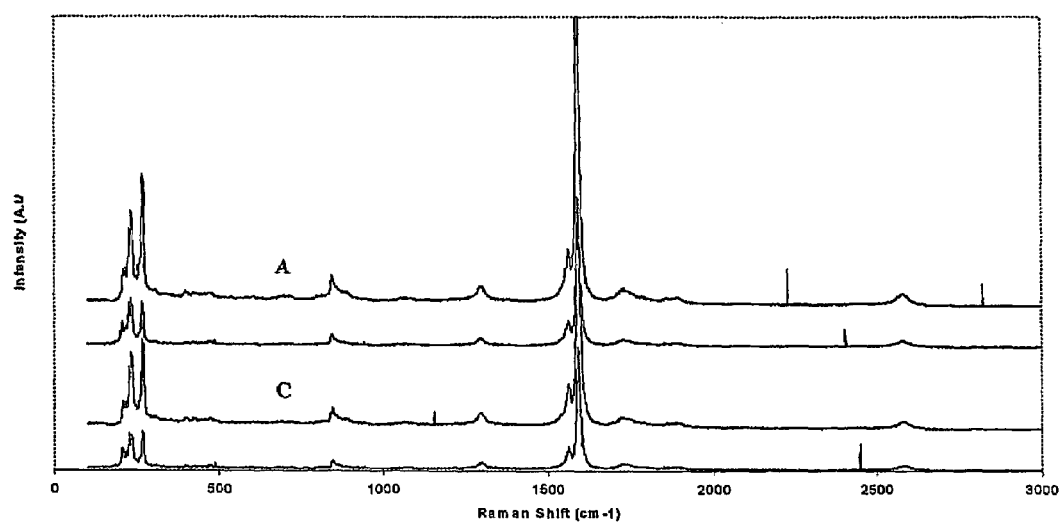
FIG. 3 depicts Raman spectra of (a) pre- and (b) post-irradiation of 1.5% and (c) pre- and (d) post-irradiation of 5% wt. non-fluorinated HiPco SWNTs/MDPE.

The Raman spectroscopy results suggested that the proton radiation had less of an effect on the fluorinated laser-generated SWNTs than on the fluorinated HiPco-produced SWNTs, as seen in FIGS. 1-3. The significant features of the pre-irradiation Raman spectra of the laser-generated F-SWNT's (Tubes@Rice) in FIG. 1, are still seen in the spectra post-irradiation. The fluorinated HiPco tubes appeared to defluorinate after radiation because the Raman spectra resemble non-fluorinated HiPco tubes post-radiation as seen in FIG. 2. The non-fluorinated SWNTs showed no remarkable change on going from pre- to post-irradiation, as seen in FIG. 3. The difference in percentage weight loss of the 1.5 wt. % and 5 wt. % SWNT loadings showed negligible differences between the pre- and post-irradiation for both the fluorinated and non-fluorinated SWNTs. The Raman spectra of a control sample of unfilled PE showed no significant change after irradiation.

Figure 4:
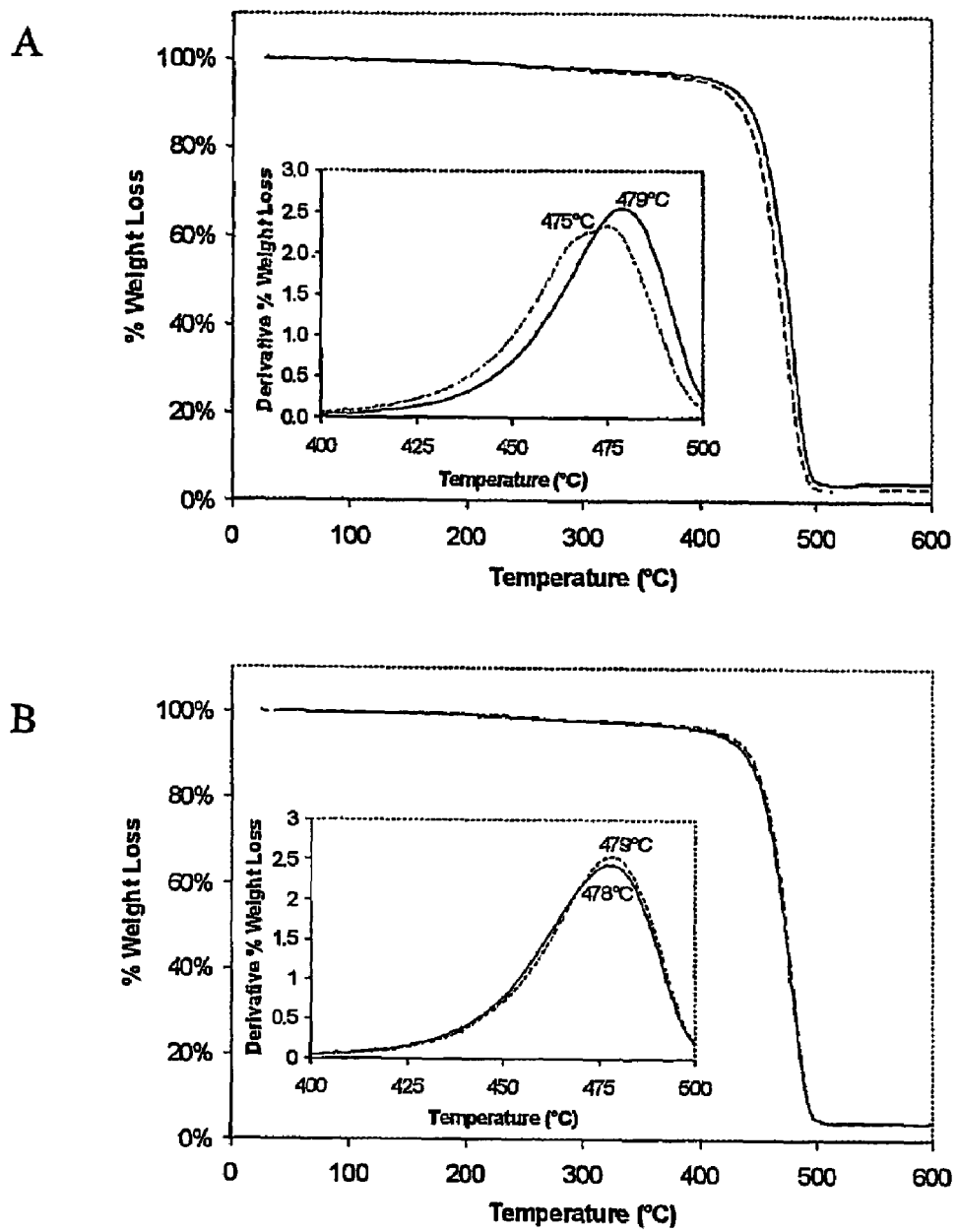
FIG. 4 depicts TGA results for the composites containing 5 wt. % F-SWNTs (dashed lines) and 5 wt. % purified SWNTs (solid lines), before (a) and after (b) irradiation

The TGA results in FIG. 4, show that no detrimental changes in the thermal degradation properties of the unfilled polymer or the composites occurred due to radiation exposure. All samples decomposed in one step with the maximum weight loss occurring at a temperature between 469° C. and 479° C. The composite comprising purified, unfunctionalized SWNTs and fluorinated Tubes@Rice-produced SWNTs did not show any appreciable change at the temperature where this peak occurred, but the peak position for the composites containing fluorinated HiPco SWNTs shifted to a higher temperature. In both the 1.5 wt. % and 5 wt. % F-SWNT composites, the inflection point shifted approximately 4° C. to correspond with their purified SWNT counterparts corroborating the defluorination observed in the Raman spectra. FIG. 4 shows the percent weight loss curves and the derivative percent weight loss curves in the inset plotted against temperature for the composites containing 5 wt. % purified SWNTs and 5 wt. % F-SWNTs. The curves for the other materials; unfilled polyethylene, 1.5 wt. % F-SWNT (Tubes@Rice)/MDPE, 1.5 wt. % purified SWNT/MDPE, and 5 wt. % purified SWNT/MDPE; agreed within one degree, indicating that no radiation-induced damage occurred in these materials.

FIG. 4 depicts the TGA results for the composites containing 5 wt. % F-SWNTs (dashed lines) and 5 wt. % purified SWNTs (solid lines). The left graph shows the TGA data for the composite materials prior to radiation exposure and the right graph shows the TGA data for the materials following radiation exposure. The curves for the composite containing F-SWNTs shift to higher temperatures following radiation exposure suggesting that the fluorine functional groups are removed by the radiation.

These results indicate that radiation exposure with 40 MeV protons induces defluorination of the HiPco SWNTs, as evidenced in the Raman spectra and by TGA results. The proton exposures were consistent with a long-term mission in LEO. This is significant since it would serve as a basis to explore future applications of SWNTs in space. A similar effect is not observed in the fluorinated Tubes@Rice SWNTs. While not intending to be bound by theory, this suggests that the diameter and curvature of the CNTs and the conditions under which they are functionalized play a role in any radiation-induced defunctionalization process they might be subjected to. Therefore materials can be manipulated such that they are defunctionalized on demand to produce CNTs with an altered level and/or type of functionalization.

Example 2

This Example serves to illustrate a manner in which a sensor of the present invention comprising functionalized CNTs and a polymer host matrix can be used as a radiation dosimeter.

The present invention is directed toward radiation sensors (e.g., dosimeters) comprising functionalized CNTs in a polymeric host material. In some embodiments, such a device comprises a dielectric substrate on which a layer of functionalized CNT-polymer composite and/or blend is deposited. Using a power source, a voltage can be applied across this layer. As the device is exposed to radiation that defunctionalizes the functionalized CNTs, there is an increase in current across the layer. With calibration and a thorough understanding of the interactions of particular kinds of radiation with a particular type of functionalized CNT, it is possible to monitor radiation dosages and fluences in real time. The device components are easily miniaturized such that the device can be worn by a person as a radiation badge. This offers many advantages to traditional radiation badges which must be sent out for analysis, informing the wearing of a large dose of radiation only after the fact. Other variants of these radiation sensors are not worn by individuals, rather they are used to simply monitor a particular environment or environments for radiation. In some embodiments, such radiation sensors can be incorporated into the hull of a spacecraft, often sensing different kinds of radiation, at differing depths in order to evaluate both the type and dosage of various types of incident radiation. In some embodiments, the sensor can be made using ink jet methodologies to reduce the device size and ensure alignment (or randomness) of the CNTs within the host matrix.

Example 3

This Example serves to illustrate multi-functional materials of the present invention, comprising functionalized CNTs and a host material, that can be used in time-dependent applications.

Embodiments directed toward multi-functional materials comprising functionalized CNTs and a host material often rely on changes in said materials as they are exposed to radiation over a period of time—continuously changing the properties of the materials.

As an example, functionalized CNTs dispersed in motor oil could be engineered to impart gradual changes to the viscosity of such a fluid when exposed to a particular type of radiation. This would permit the tuning of the oil's viscosity in situ, without having to change it. Furthermore, after having altered the oil's viscosity to a sufficient extent, the oil could be used for an entirely different purpose. Additionally, or alternatively, such time-dependent behavior could be made to respond to other environmental input (e.g., heat, pressure, stress, etc.).

Example 4

This Example serves to illustrate how interactions of functionalized CNT-polymer composites and/or blends of the present invention with radiation can be employed to recycle or reclaim the CNTs as the device or material comprising them nears the end of its life.

Because CNTs are still relatively difficult to produce and have a corresponding high cost associated with them, it may be advantageous in some situations to somehow reclaim them at some point. Thus, the present invention is also directed toward methods of recapturing or recycling nanotubes from composites and/or blends comprising functionalized carbon nanotubes and a polymer host matrix.

For functionalized CNTs in a polymer matrix (e.g., polyethylene), reclaiming the CNTs involves both their separation from the polymer matrix and their defunctionalization. Because of the high level of chemical inertness the CNTs possess, the polymer matrix can be chemically dissolved with an appropriate solvent (e.g., tetrahydrofuran), it can be oxidatively removed with an oxidizing agent (e.g., sulfuric acid), or burned in oxygen. The functionalized CNTs can be defunctionalized either before or after separation from the polymer matrix using a radiative means capable of removing said functionalization. The combination of these two processes yields a unfunctionalized CNT product. Note that in some embodiments, the defunctionalization occurs as a result of a material's use (e.g., in a space environment) and subsequent matrix removal serves to complete the recycling process. These processes can be engineered into the material so that the process occurs over an extended time in an effort to reclaim the material (CNTs) rather than for them to go into landfills.

Although the present invention and its advantages have been described in detail, it should be understood that various changes, substitutions and alterations can be made herein without departing from the spirit and scope of the invention as defined by the appended claims.

What is claimed is:

1. A method comprising the steps of:
   a) dispersing functionalized carbon nanotubes in a solvent to form a dispersion of functionalized carbon nanotubes;
   b) incorporating the dispersion of functionalized carbon nanotubes into a polymer host matrix to form a functionalized carbon nanotube-polymer composite; and
   c) modifying the functionalized carbon nanotube-polymer composite with radiation, wherein the modifying comprises defunctionalizing of the functionalized carbon nanotubes and wherein the radiation is selected from the group consisting of protons, neutrons, alpha particles, heavy ions, cosmic radiation, solar wind, and combinations thereof.

2. The method of claim 1, wherein the carbon nanotubes are single-wall carbon nanotubes.

3. The method of claim 1, wherein the functionalized carbon nanotubes are fluorinated carbon nanotubes.

4. The method of claim 1, wherein the dispersion is formed with a solvent selected from the group consisting of alcohols, N,N-dimethylformamide, benzene, toluene, xylene, dichlorobenzene, chloroform, dichloromethane, and combinations thereof.

5. The method of claim 1, wherein the step of incorporating the dispersion of functionalized carbon nanotubes into a polymer host matrix comprises an incipient wetting of polymer material, of a form selected from the group consisting of particles, fibers, and combinations thereof, followed by solvent removal and blending.

6. The method of claim 1, wherein the step of incorporating the dispersion of functionalized carbon nanotubes into a polymer host matrix comprises mixing the dispersion with polymeric precursors and polymerizing in situ.

7. The method of claim 1, wherein functionalized carbon nanotubes comprise from about 0.001 weight percent to about 99 weight percent of the functionalized carbon nanotube-polymer composite.

8. The method of claim 1, wherein functionalized carbon nanotubes comprise from about 0.2 weight percent to about 30 weight percent of the functionalized carbon nanotube-polymer composite.

9. The method of claim 1, wherein the modifying further comprises changes in electrical properties.

* * * * *